(12) United States Patent
Lin et al.

(10) Patent No.: US 11,811,198 B2
(45) Date of Patent: Nov. 7, 2023

(54) HIGH POWER LASER ARRAY DEVICES AND METHODS

(71) Applicant: FINISAR CORPORATION, Sunnyvale, CA (US)

(72) Inventors: Shiyun Lin, San Diego, CA (US); Tsurugi Sudo, San Jose, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 446 days.

(21) Appl. No.: 16/906,909

(22) Filed: Jun. 19, 2020

(65) Prior Publication Data

US 2021/0028593 A1     Jan. 28, 2021

Related U.S. Application Data

(60) Provisional application No. 62/876,919, filed on Jul. 22, 2019.

(51) Int. Cl.
*H01S 5/026* (2006.01)
*H01S 5/40* (2006.01)

(52) U.S. Cl.
CPC ............ *H01S 5/4068* (2013.01); *H01S 5/026* (2013.01)

(58) Field of Classification Search
CPC ....... H01S 5/026; H01S 5/4025; H01S 5/4068
See application file for complete search history.

(56) References Cited

U.S. PATENT DOCUMENTS

| | | | | | |
|---|---|---|---|---|---|
| 5,173,957 | A | * | 12/1992 | Bergano | H01S 3/094003 385/24 |
| 5,793,521 | A | * | 8/1998 | O'Brien | H01S 5/026 359/344 |
| 2006/0203858 | A1 | * | 9/2006 | Arimoto | H01S 5/4068 372/20 |

FOREIGN PATENT DOCUMENTS

GB          2371407        *     7/2002

\* cited by examiner

*Primary Examiner* — Michael Carter
(74) *Attorney, Agent, or Firm* — Blank Rome LLP

(57) ABSTRACT

In one example, an optoelectronic assembly may include a laser array, an amplifier array, and a multimode interference coupler optically coupling the laser array and the amplifier array. The laser array may include at least one primary laser and at least one spare laser configured to be activated if the primary laser fails. The amplifier array may include at least two amplifiers configured to amplify optical signals received from the laser array.

20 Claims, 7 Drawing Sheets

HIGH POWER LASER ARRAY DEVICES AND METHODS

CROSS-REFERENCE TO RELATED APPLICATIONS

This application claims priority to and the benefit of U.S. Provisional Patent Application No. 62/876,919, filed Jul. 22, 2019, titled HIGH POWER LASER ARRAY DEVICES AND METHODS, which is incorporated herein by reference in its entirety.

BACKGROUND

Unless otherwise indicated herein, the materials described herein are not prior art to the claims in the present application and are not admitted to be prior art by inclusion in this section.

The present disclosure generally relates to laser arrays and optics for optoelectronic modules.

Optoelectronic modules, such as transceivers, may be used to transmit data between different devices or different locations. In particular, optical signals may be used to rapidly communication data (via the optical signals) between different devices or different locations. However, most electronic devices operate using electrical signals. Accordingly, optoelectronic modules may be used to convert optical signals to electrical signals and/or convert electrical signals to optical signals, so the optical signals may be used to transmit data between electronic devices. Optoelectronic modules typically communicate with a host device by transmitting electrical signals to the host device and receiving electrical signals from the host device. These electrical signals may then be transmitted by the optoelectronic module as optical signals.

The claimed subject matter is not limited to embodiments that solve any disadvantages or that operate only in environments such as those described above. This background is only provided to illustrate examples of where the present disclosure may be utilized.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

The present disclosure generally relates to laser arrays and optics for optoelectronic modules.

In one example, an optoelectronic assembly may include a laser array, an amplifier array, and a multimode interference coupler optically coupling the laser array and the amplifier array. The laser array may include at least one primary laser and at least one spare laser configured to be activated if the primary laser fails. The amplifier array may include at least two amplifiers configured to amplify optical signals received from the laser array. The multimode interference coupler may include a quantum well intermixing region that is transparent to wavelengths of light generated by the laser array. The quantum well intermixing region may be integrally formed on a single optoelectronic chip with the laser array, the multimode interference coupler and the amplifier array.

In another example, a method may be implemented to form a multimode interference coupler optically coupled between a laser array and an amplifier array. The method may include depositing a quantum well and barrier layer on a substrate and depositing a buffer layer on the quantum well and barrier layer. In some aspects, the method may include depositing a cap layer on the buffer layer, ion implanting the buffer layer, annealing to diffuse vacancies in the quantum well and barrier layer, and removing the cap layer and the buffer layer. The annealing may create a multimode interference region in the quantum well and barrier layer. Additionally or alternatively, the annealing may create a spot size converter region in the quantum well and barrier layer.

In other aspects, the method may include depositing a hard mask on the quantum well and barrier layer, patterning a mask on the hard mask, etching to remove portions not covered by the mask, selective regrowing butt joints in spaces of the quantum well and barrier layer exposed during etching, and removing the mask and/or the hard mask.

In yet another example, an optoelectronic assembly may include a laser array, an amplifier array, and a directional coupler optically coupling the laser array and the amplifier array. The laser array may include at least one primary laser and at least one spare laser configured to be activated if the primary laser fails. The amplifier array may include at least two amplifiers configured to amplify optical signals received from the laser array.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

The present disclosure generally relates to laser arrays and optics for optoelectronic modules.

As optoelectronic modules are increasingly used to communicate data, the demand for more compact and higher bandwidth optoelectronic modules also increases. To increase bandwidth and create more compact optoelectronic modules, the density of components in the optoelectronic modules may also be increased. High density laser sources with many lasers integrated into a small space may be necessary for high bandwidth modules such as co-packaged optics. Laser arrays with multiple lasers integrated on one chip provide a high-density and low-cost solution comparing to the conventional discrete lasers. However, integrating multiple lasers on the same chip may lead to various challenges.

For example, one way to increase bandwidth is to increase the number of lasers used to communicate optical signals. However, to increase the number of lasers while maintaining a compact optoelectronic module design, lasers and their associated optical components must be positioned close to one another. Doing so may result in lower reliability and decreased yields because of tolerances related to manufacturing of the lasers and optical components. Further, positioning multiple lasers on a chip may result in lower yields or decreased reliability because one failed laser in the array would cause the failure of the whole array.

Accordingly, the disclosed configurations include optoelectronic modules with compact high-density laser arrays, while maintaining high yields and reliability. In particular, the present disclosure includes optoelectronic modules with co-packaged optics, high power lasers and many channels. The disclosed embodiments include lasers with relatively high power, low cost, and high density. The disclosed laser array configurations are more compact compared to laser assemblies with free space-based optical coupling configurations. Furthermore, the disclosed configurations include high-power laser arrays chip with more channels on a single chip.

Reference will be made to the drawings and specific language will be used to describe various aspects of the disclosure. Using the drawings and description in this manner should not be construed as limiting its scope. Additional aspects may be apparent in light of the disclosure, including the claims, or may be learned by practice.

Figure 1A:
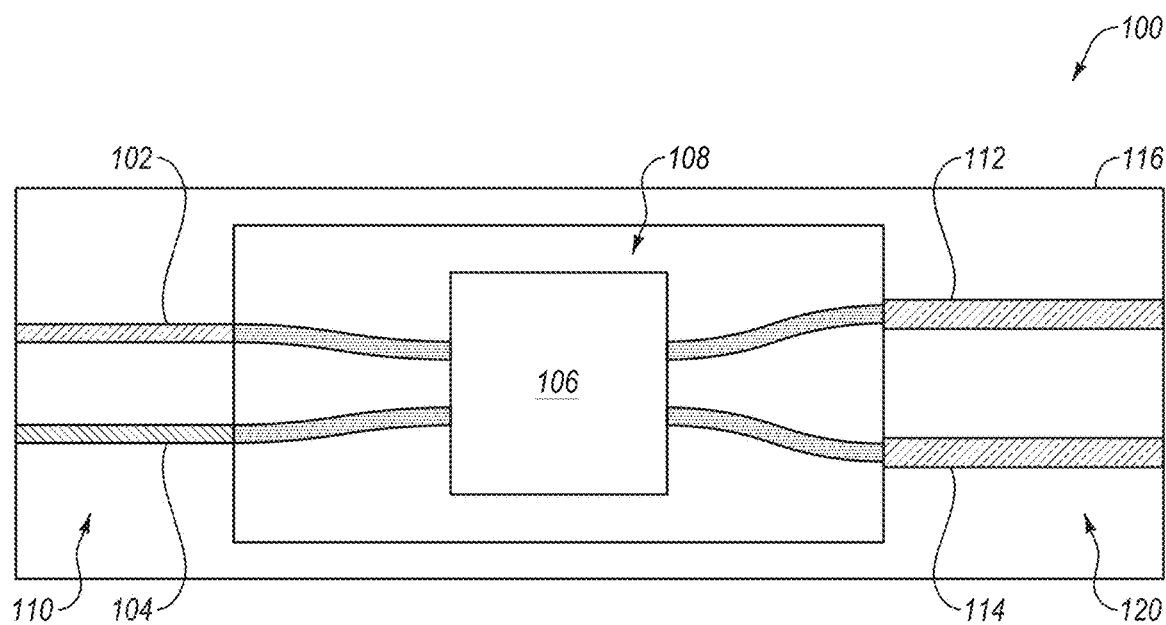
FIG. 1A is a schematic view of an example optoelectronic assembly.

FIG. 1A is a schematic view of an example optoelectronic assembly 100. The optoelectronic assembly 100 includes a laser array 110, which may be an array of distributed feedback lasers (DFBs), or other transmitter array suitable for optical communication. The laser array 110 may include a first laser 102 and a second laser 104. In some configurations, the laser 102 may be a primary laser and the laser 104 may be a spare laser, which may be activated if the primary laser fails or becomes in-operational.

A multimode interference (MMI) coupler 106 may be optically coupled to the laser array 110. The MMI coupler 106 may split, multiplex the optical signals from the laser array 110. An amplifier array 120 may be optically coupled to the MMI coupler 106 and may amplify the optical signals received from the laser array 110 via the MMI coupler 106. The amplifier array 120 may include a first amplifier 112 and a second amplifier 114. The MMI coupler 106 may optically couple the lasers 102, 104 of the laser array 110 on its input side with the amplifiers 112, 114 of the amplifier array 120 on the output side. Thus, relatively low power optical signals may be received from the MMI coupler 106 at the amplifier array 120, and relatively high-power optical signals may be output from the amplifier array 120. In some configurations, the laser array 110 and the amplifier array 120 may be optically coupled to the MMI coupler 106 using waveguides, with one waveguide corresponding to each of the lasers 102, 104 and the amplifiers 112, 114, as shown.

In some configurations, the laser array 110, the MMI coupler 106 and the amplifier array 120 may be included on a single optoelectronic chip 116, thereby reducing the size and cost of the resulting assembly. In addition, since the laser array 110 includes the primary laser 102 and the spare laser 104, which may be activated if the primary laser 102 fails, the manufacturing yield and reliability of the optoelectronic assembly 100 may be improved.

In the illustrated configuration, the MMI coupler 106 is a 2×2 MMI coupler, meaning the MMI coupler 106 includes two inputs and two outputs. The inputs correspond with the two lasers 102, 104, and the outputs correspond with the two amplifiers 112, 114. Optical signals from the laser 102 may enter the MMI coupler 106 and may be split in half by the MMI coupler 106, with about half of the optical signals traveling to the amplifier 112 and the other half of the optical signals traveling to the amplifier 114. Similarly, optical signals from the laser 104 may enter the MMI coupler 106 and may be split (e.g., in half) by the MMI coupler 106, with about half of the optical signals traveling to the amplifier 112 and the other half of the optical signals traveling to the amplifier 114. In such configurations, the optical signals entering the amplifiers 112, 114 may be substantially the same (e.g., half of the optical signals generated by the laser 102 or the laser 104). Accordingly, the MMI coupler 106 may be configured as a splitter.

If the laser 104 is configured as a spare for the laser 102, both lasers may generate the same or similar optical signals, depending on which one is activated, and the MMI coupler 106 may split the optical signals in the same manner, regardless of whether the optical signals are generated by the laser 102 or the laser 104.

As mentioned above, the MMI coupler 106 may also be configured as a multiplexer (mux). For example, if the lasers 102, 104 are operating at the same time, the MMI coupler 106 may combine the optical signals (thereby operating as a multiplexer to multiplex the optical signals). The MMI coupler 106 may also split the combined optical signals, for example, such that half of the combined optical signals travel through the first output to the amplifier 112, and the other half of the combined optical signals travel through the second output to the amplifier 114. Accordingly, the optical signals entering the amplifiers 112, 114 may be substantially the same (e.g., half of the combined optical signals generated by both the laser 102 and the laser 104). In such configurations, the power of the optical signals from both of the lasers 102, 104 may be combined in the MMI coupler 106.

In some configurations, the lasers 102, 104 may each generate optical signals with different wavelengths, which in turn may be multiplexed by the MMI coupler 106 to generate combined optical signals with two different wavelengths, which are in turn split by the MMI coupler 106 and output to the amplifiers 112, 114. In such configurations, the optical signals entering the amplifiers 112, 114 may each include half of the combined optical signals with two different wavelengths generated by both the laser 102 and the laser 104.

The optoelectronic assembly 100 may include a quantum well intermixing region 108, which may be included in the MMI coupler 106 and/or in the waveguides coupling the MMI coupler 106. The quantum well intermixing region 108 may be a region of material that is transparent to the wavelengths of light generated by the lasers 102, 104, so optical signals generated by the lasers 102, 104 are not absorbed or lost as they travel through the MMI coupler 106. In such circumstances, the MMI coupler 106 may be a passive optical component.

The quantum well intermixing region 108 may be integrally formed on the optoelectronic chip 116. For example, the quantum well intermixing region 108 may formed by changing the band gap of the material of the optoelectronic chip 116 in the area of the MMI coupler 106. The quantum well intermixing region 108 may be doped and annealed in the quantum well intermixing region 108 thereby changing the composition and the band gap of the material, such that the material does not absorb desired wavelengths of optical signals (e.g., the wavelengths generated by the lasers 102, 104).

Figure 1B:
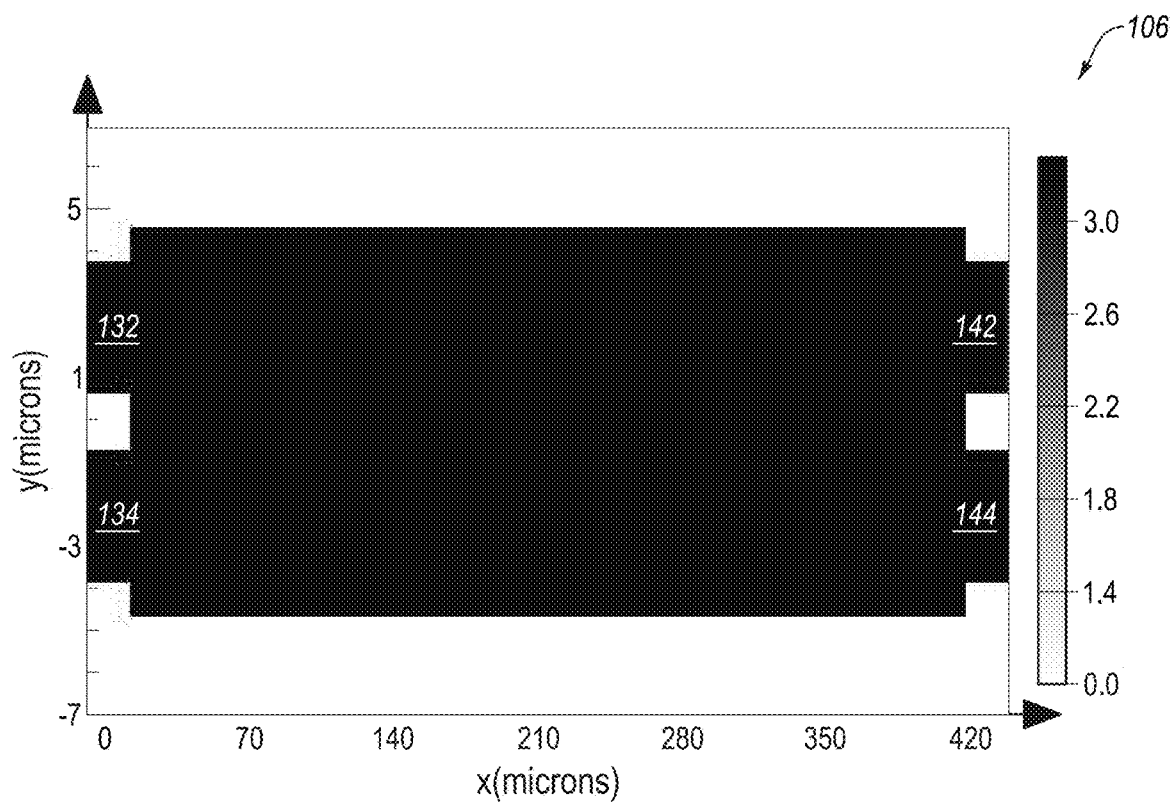
FIG. 1B is a schematic view of an example multimode interference coupler that may be implemented in the optoelectronic assembly of FIG. 1A.

FIG. 1B is a schematic view of the MMI coupler 106. In FIG. 1B, the x-axis represents dimensions of the MMI coupler 106 in microns in a first direction, and the y-axis represents dimensions of the MMI coupler 106 in microns in a second direction (e.g., perpendicular to the first). The refractive index of the MMI coupler 106 is indicated with gradient shading, according to the scale on the right side of the figure.

As explained above, the MMI coupler 106 is a 2×2 MMI coupler including two inputs 132, 134 and two outputs 142, 144. The inputs 132, 134 correspond with the two lasers 102, 104, and the outputs 142, 144 correspond with the two amplifiers 112, 114. Optical signals from the laser 102 may enter the MMI coupler 106 via the input 132 and may be split in half by the MMI coupler 106, with about half of the optical signals traveling to the output 142 and the other half of the optical signals traveling to the output 144. Similarly, optical signals from the laser 104 may enter the MMI coupler 106 via the input 134 and may be split in half by the MMI coupler 106, with about half of the optical signals traveling to the output 142 and the other half of the optical signals traveling to the output 144.

Figure 1C:
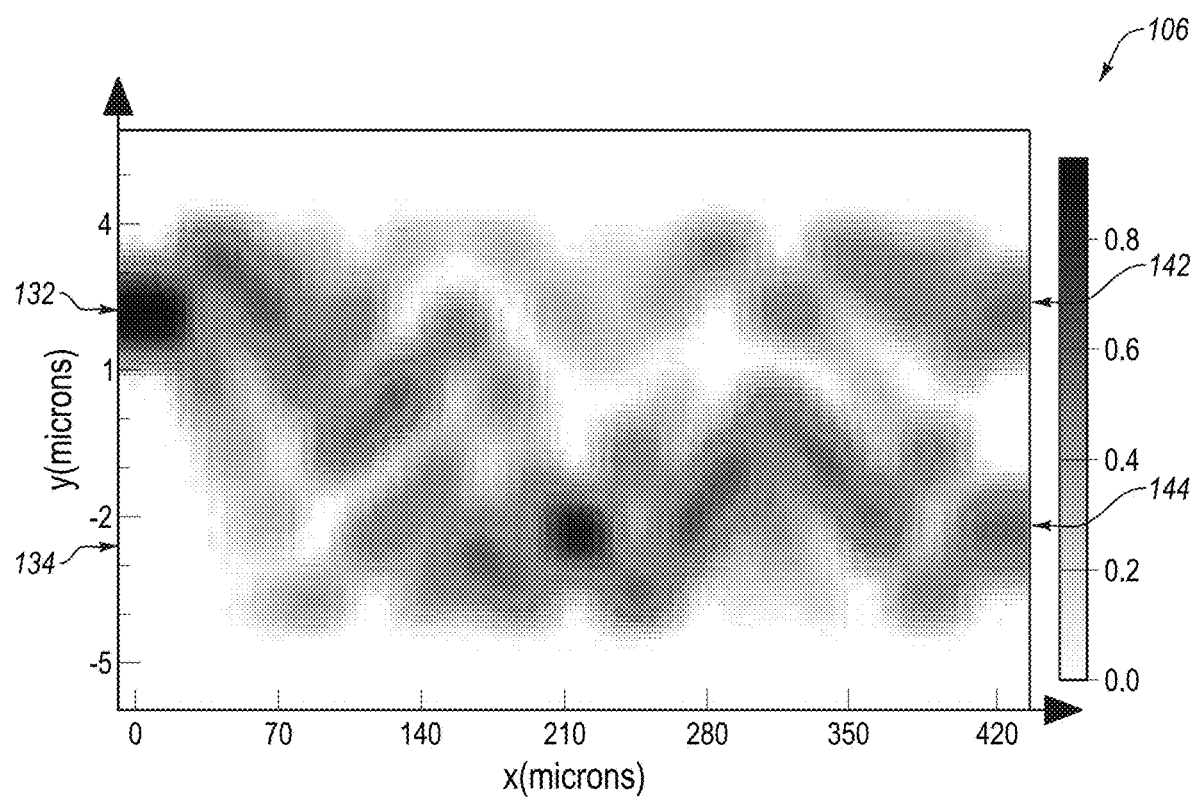
FIGS. 1C-1D are schematic views of optical signals travelling through the multimode interference coupler of FIG. 1B.
Figure 1D:
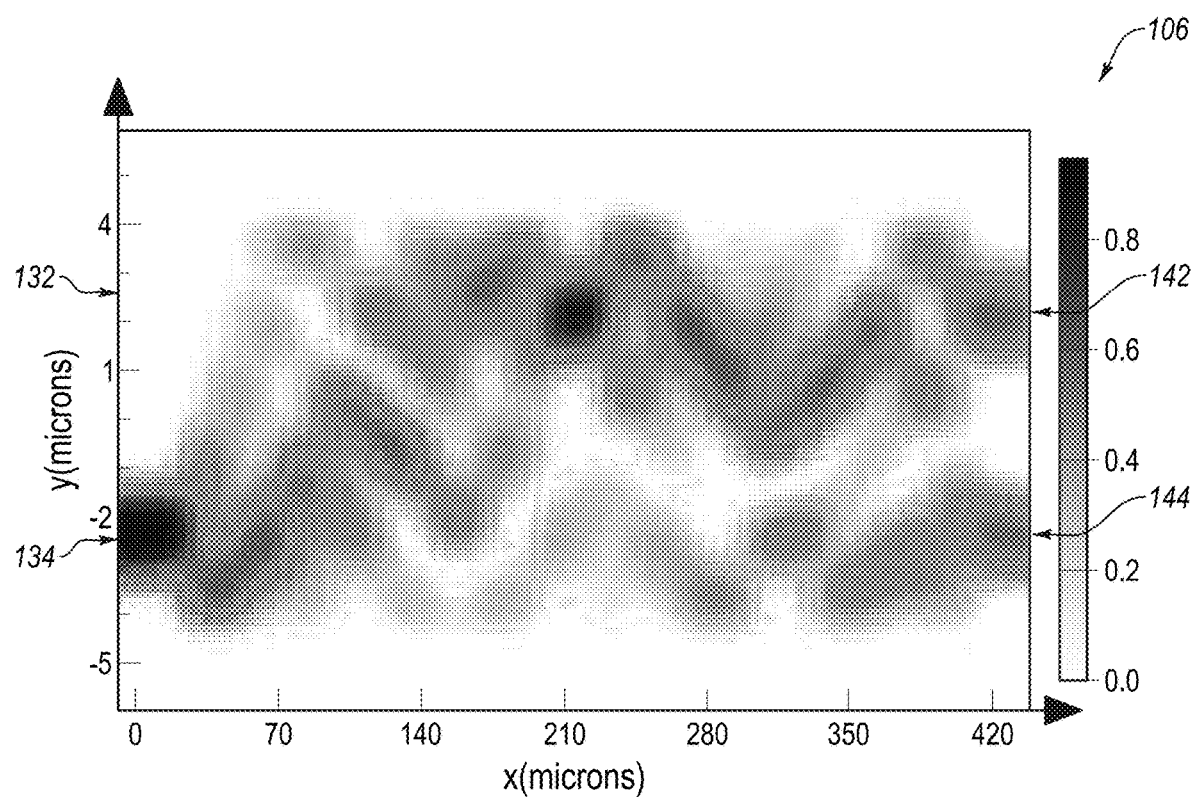

FIGS. 1C-1D are schematic views of optical signals travelling through the MMI coupler 106. In FIGS. 1C-1D, the x-axis represents dimensions of the MMI coupler 106 in microns in a first direction, and the y-axis represents dimensions of the MMI coupler 106 in microns in a second direction (e.g., perpendicular to the first). The optical field intensity travelling through the MMI coupler 106 is indicated with gradient shading, according to the scale on the right side of the figures.

As shown in FIG. 1C, optical signals from the laser 102 may enter the MMI coupler 106 via the input 132. The optical signals may be propagate through the MMI coupler 106 and may travel to the outputs 142, 144. Accordingly, the optical signals may be split in half by the MMI coupler 106, with about half of the optical signals traveling to the output 142 and the other half of the optical signals traveling to the output 144. Similarly, as shown in FIG. 1D, optical signals from the laser 104 may enter the MMI coupler 106 via the input 134. The optical signals may be propagate through the MMI coupler 106 and may travel to the outputs 142, 144. Accordingly, the optical signals may be split in half by the MMI coupler 106, with about half of the optical signals traveling to the output 142 and the other half of the optical signals traveling to the output 144. In such configurations, the optical signals entering the amplifiers 112, 114 may be substantially the same (e.g., half of the optical signals generated by the laser 102 or the laser 104). Accordingly, the MMI coupler 106 may be configured as a splitter.

Other configurations besides a quantum well intermixing region may be implemented to reduce or eliminate absorption loss in the MMI coupler 106. For example, a butt joint and/or selective regrowth region may be used to create passive regions in the MMI coupler 106 such that optical signals travelling through the MMI coupler 106 are not absorbed. Such configurations will be described in further detail below.

Although the configuration of the optoelectronic assembly 100 includes two lasers 102, 104 and two outputs optically coupled to the amplifiers 112, 114, other configurations may implemented with different numbers of lasers, inputs, outputs and amplifiers. Accordingly, the MMI coupler 106 may have any suitable number of inputs and outputs, depending on the desired configuration.

Figure 2:
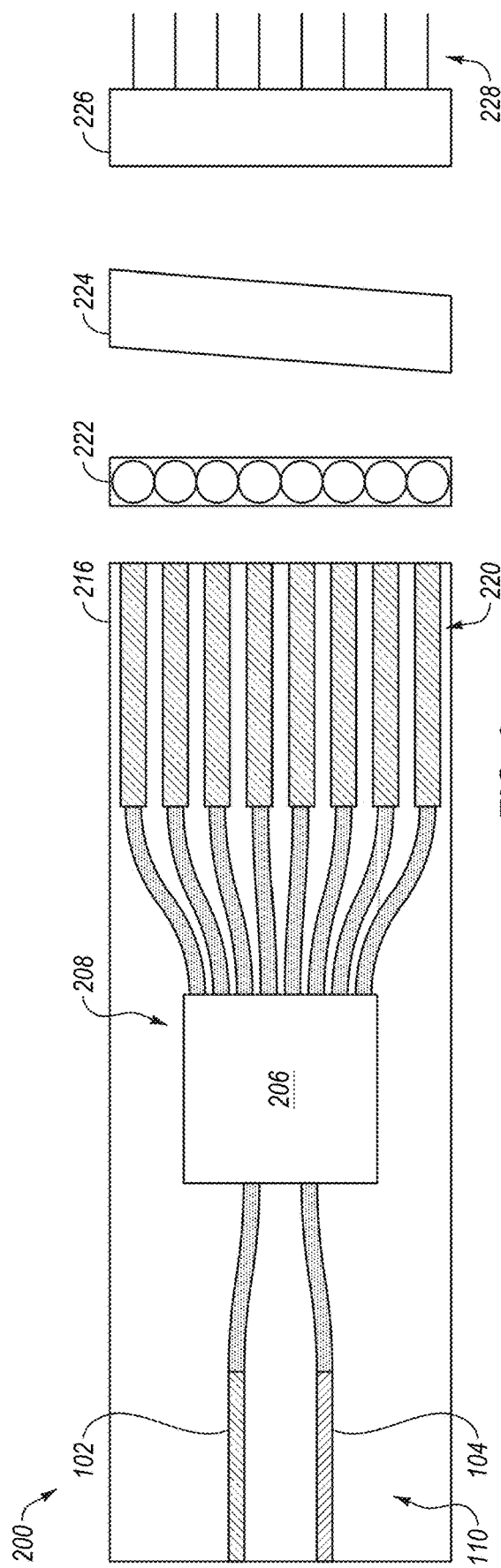
FIG. 2 is a schematic view of another example optoelectronic assembly.

FIG. 2 is a schematic view of another example optoelectronic assembly 200. In the illustrated configuration, the optoelectronic assembly 200 includes two inputs and eight outputs. The optoelectronic assembly 200 may include any suitable aspects described with respect to the optoelectronic assembly 100, and similar components have been indicated with similar numbering for brevity.

Similar to the optoelectronic assembly 100, the optoelectronic assembly 200 includes the two lasers 102, 104 in the laser array 110. However, the optoelectronic assembly 200 includes an MMI coupler 206 with eight outputs and two inputs. The two inputs correspond to the lasers 102, 104, and the eight outputs correspond to eight amplifiers in an amplifier array 220. The amplifier array 220 may be optically coupled to the MMI coupler 206 and may amplify the eight sets of optical signals received from the laser array 110 via the MMI coupler 206. Accordingly, the number of output channels of the optoelectronic assembly 200 is increased to eight by increasing the number of output ports of the MMI coupler 206 to eight (compared to the two output ports in the MMI coupler 106 of FIGS. 1A-1B).

As described above, in some configurations, the laser 102 may be a primary laser and the laser 104 may be a spare laser, which may be activated if the primary laser fails or becomes in-operational. In some configurations, the laser array 110, the MMI coupler 206 and the amplifier array 220 may be included on a single optoelectronic chip 216, thereby reducing the size and cost of the resulting assembly.

As illustrated in FIG. 2, the optoelectronic assembly 200 may include a lens array 222, an isolator 224, and a fiber array 226. The lens array 222 may include lenses, each corresponding to an output of one of the amplifiers of the amplifier array 220. Accordingly, in the illustrated embodiment the lens array 222 includes eight lenses, one for each of the output ports of the MMI coupler 206 or the output channels of the optoelectronic assembly 200. However, other configurations may also be implemented. The lenses of the lens array 222 may focus or modulate optical signals travelling from the amplifier array 220.

The isolator 224 may permit optical signals to travel only in one direction, thereby preventing undesired reflections or feedback. In particular, the isolator 224 may permit optical signals to travel from the lens array 222 to the fiber array 226, but not vice versa. The fiber array 226 may be an array of polarization maintaining fibers. In the illustrated configuration, the fiber array 226 includes eight optical fibers 228, with each of the optical fibers 228 corresponding to one of the output ports of the MMI coupler 206 or one of the output channels of the optoelectronic assembly 200. In some configurations, the fiber array 226 may include a polarization maintaining fiber connector. Although the lens array 222, the isolator 224, and the fiber array 226 is shown and described with respect to the optoelectronic assembly 200, such aspects may be implemented in any of the embodiments described herein.

In some configurations, the lens array 222 may have the same or similar pitch as the amplifier array 220, the isolator 224, and/or the fiber array 226. Furthermore, the lens array 222 may have a pitch that corresponds to the amplifier array 220, the isolator 224, and/or the fiber array 226. In such configurations, light or optical signals from the amplifiers of the amplifier array 220 may be optically coupled with the fiber array 226.

In the illustrated configuration, the MMI coupler 206 is a 2×8 MMI coupler, meaning the MMI coupler 206 includes two inputs and eight outputs. The inputs correspond with the two lasers 102, 104, and the outputs correspond with the eight amplifiers in the amplifier array 220. Optical signals from the laser 102 may enter the MMI coupler 206 and may be split by the MMI coupler 206, with about one eighth of the optical signals traveling to each of the amplifiers in the amplifier array 220. Similarly, optical signals from the laser 104 may enter the MMI coupler 206 and may be split by the MMI coupler 206, with about one eighth of the optical signals traveling to each of the amplifiers in the amplifier array 220. In such configurations, the optical signals entering the amplifiers of the amplifier array 220 may be substantially the same (e.g., one eighth of the optical signals generated by the laser 102 or the laser 104). Accordingly, the MMI coupler 206 may be configured as a splitter.

The MMI coupler 206 may also be configured as a multiplexer (mux). For example, if the lasers 102, 104 are operating at the same time, the MMI coupler 206 may combine the optical signals (thereby operating as a multiplexer to multiplex the optical signals). The MMI coupler 206 may also split the combined optical signals, for example, such that about one eighth of the combined optical signals traveling to each of the amplifiers in the amplifier array 220. Accordingly, the optical signals entering each of the amplifiers in the amplifier array 220 may be substantially the same (e.g., one eighth of the combined optical signals generated by both the laser 102 and the laser 104). In such configurations, the power of the optical signals from both of the lasers 102, 104 may be combined in the MMI coupler 206.

As explained above, the lasers 102, 104 may each generate optical signals with different wavelengths, which in turn may be multiplexed by the MMI coupler 206 to generate combined optical signals with two different wavelengths, which are in turn split by the MMI coupler 206 and output to the amplifiers of the amplifier array 220. In such configurations, the optical signals entering the amplifiers of the amplifier array 220 may each include one eighth of the combined optical signals with two different wavelengths generated by both the laser 102 and the laser 104.

The optoelectronic assembly 200 may include a quantum well intermixing region 208, which may be included in MMI coupler 206 and/or in the waveguides coupling the MMI coupler 206. The quantum well intermixing region 208 may be a region of material that is transparent to the wavelengths of light generated by the lasers 102, 104, so optical signals generated by the lasers 102, 104 are not absorbed or lost as they travel through the MMI coupler 206. In such circumstances, the MMI coupler 206 may be a passive optical component.

The quantum well intermixing region 208 may be integrally formed on the optoelectronic chip 216. For example, the quantum well intermixing region 208 may formed by changing the band gap of the material of the optoelectronic chip 216 in the area of the MMI coupler 206. The quantum well intermixing region 208 may be doped and annealed in the quantum well intermixing region 208 thereby changing the composition and the band gap of the material, such that the material does not absorb desired wavelengths of optical signals (e.g., the wavelengths generated by the lasers 102, 104).

Figure 3:
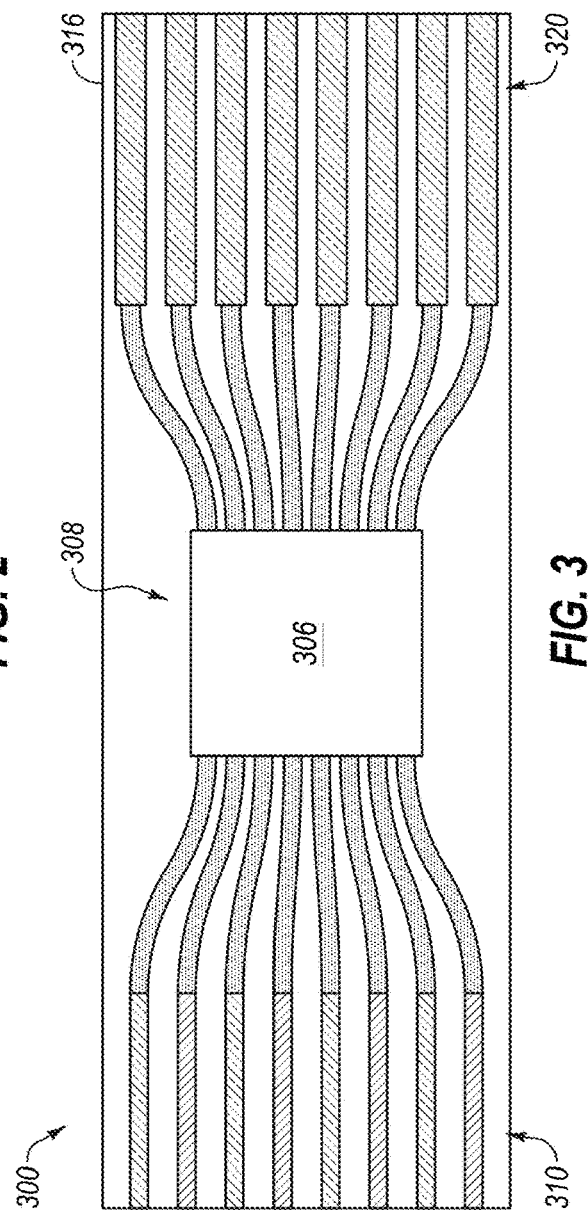
FIG. 3 is a schematic view of another example optoelectronic assembly.

FIG. 3 is a schematic view of another example optoelectronic assembly 300. In the illustrated configuration, the optoelectronic assembly 300 includes eight inputs and eight outputs. The optoelectronic assembly 300 may include any suitable aspects described with respect to the optoelectronic assemblies 100, 200.

Similar to the optoelectronic assembly 200, the optoelectronic assembly 300 includes eight outputs. However, the optoelectronic assembly 300 includes eight inputs, and eight lasers in a laser array 310. In some configurations, four of the lasers of the laser array 310 may be primary lasers and four of the lasers of the laser array 310 may be spare lasers. In such configurations, the spare lasers may be activated if one or more of the primary lasers fail or becomes inoperational. As shown, the primary lasers and the spare lasers may alternate between one another, although other configurations may be implemented. In other configurations, all eight of the lasers of the laser array 310 may be primary lasers and may operate under normal circumstances.

The optoelectronic assembly 300 may include an MMI coupler 306 with eight inputs and eight outputs. The eight inputs correspond to the lasers of the laser array 310, and the eight outputs correspond to eight amplifiers in an amplifier array 320. The amplifier array 320 may be optically coupled to the MMI coupler 306 and may amplify the eight sets of optical signals received from the MMI coupler 306. Accordingly, the number of input channels of the optoelectronic assembly 300 is increased to eight by increasing the number of input ports of the MMI coupler 306 to eight (compared to the two output ports in the MMI couplers 106, 206 of FIGS. 1 and 2). In some configurations, the laser array 310, the MMI coupler 306 and the amplifier array 320 may be included on a single optoelectronic chip 316, thereby reducing the size and cost of the resulting assembly.

In the illustrated configuration, the MMI coupler 306 is an 8×8 MMI coupler, meaning the MMI coupler 306 includes eight inputs and eight outputs. The inputs correspond with the eight lasers of the laser array 310, and the outputs correspond with the eight amplifiers in the amplifier array 320. Optical signals from the lasers of the laser array 310 may enter the MMI coupler 306 and may be split by the MMI coupler 306, with about one eighth of the optical signals traveling to each of the amplifiers in the amplifier array 320. In such configurations, the optical signals entering the amplifiers of the amplifier array 320 may be substantially the same (e.g., one eighth of the optical signals generated by the lasers of the laser array 310). Accordingly, the MMI coupler 306 may be configured as a splitter.

The MMI coupler 306 may also be configured as a multiplexer (mux). For example, if some of the lasers of the laser array 310 are operating at the same time, the MMI coupler 306 may combine the optical signals (thereby operating as a multiplexer to multiplex the optical signals). The MMI coupler 306 may also split the combined optical signals, for example, such that about one eighth of the combined optical signals traveling to each of the amplifiers in the amplifier array 320. Accordingly, the optical signals entering each of the amplifiers in the amplifier array 320 may be substantially the same (e.g., one eighth of the combined optical signals generated by both the operating lasers of the laser array 310). In such configurations, the power of the optical signals from operating lasers of the laser array 310 may be combined in the MMI coupler 306.

In some circumstances, four of the lasers of the of the laser array 310 may be primary lasers, and the remaining four lasers of the of the laser array 310 may be spare lasers. In such configurations, the four primary lasers may operate under normal conditions, and the four optical signals may be combined in the MMI coupler 306. However, if one of the primary lasers ceases to function properly, one of the spare lasers may be activated to operate instead. Accordingly, the MMI coupler 306 may combine optical signals from any of the lasers that are operating at a given time. In this manner, the yield and reliability of the optoelectronic assembly 300 may be improved. Although this example includes four primary and four spare lasers, any suitable number of primary and spare lasers may be implemented according to the concepts described herein.

In some circumstances, the lasers of the of the laser array 310 may generate optical signals with different wavelengths, which in turn may be multiplexed by the MMI coupler 306 to generate combined optical signals with different wavelengths, which are in turn split by the MMI coupler 306 and output to the amplifiers of the amplifier array 320. In such configurations, the optical signals entering the amplifiers of the amplifier array 320 may each include one eighth of the combined optical signals with different wavelengths generated by any number of the lasers of the of the laser array 310 (e.g., eight lasers if there are no spare lasers, or four lasers if there are four primary lasers).

The optoelectronic assembly 300 may include a quantum well intermixing region 308, which may be included in MMI coupler 306 and/or in the waveguides coupling the MMI coupler 306. The quantum well intermixing region 308 may be a region of material that is transparent to the wavelengths of light generated by the lasers of the laser array 310, so optical signals generated by the lasers of the laser array 310 are not absorbed or lost as they travel through the MMI coupler 306. In such circumstances, the MMI coupler 306 may be a passive optical component.

The quantum well intermixing region 308 may be integrally formed on the optoelectronic chip 316. For example, the quantum well intermixing region 308 may formed by changing the band gap of the material of the optoelectronic chip 316 in the area of the MMI coupler 306. The quantum well intermixing region 308 may be doped and annealed in the quantum well intermixing region 308 thereby changing the composition and the band gap of the material, such that the material does not absorb desired wavelengths of optical signals (e.g., the wavelengths generated by the lasers of the laser array 310).

Figure 4A:
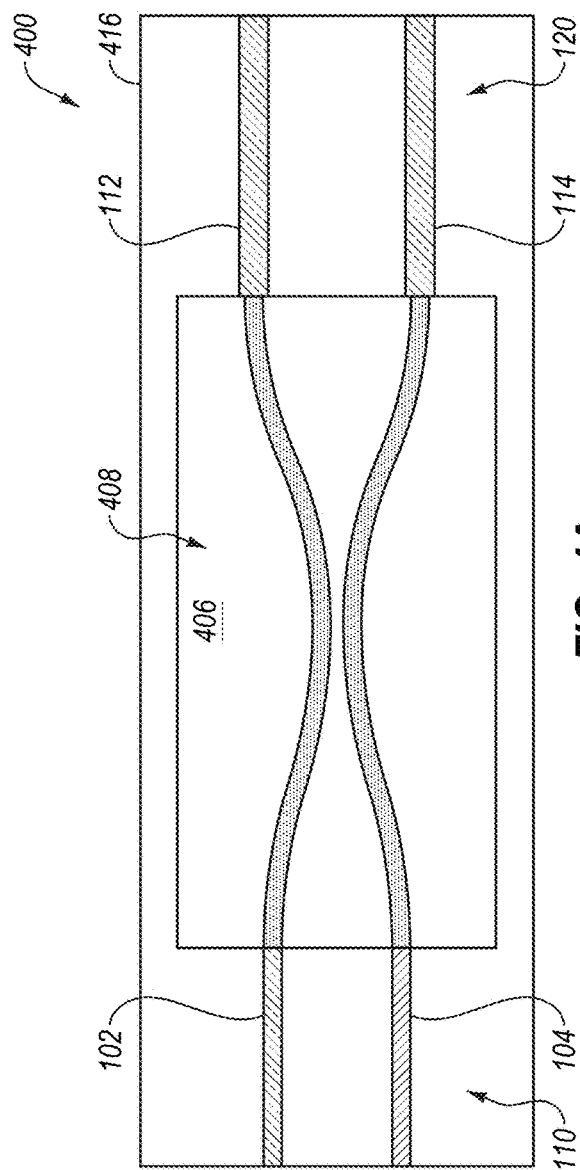
FIG. 4A is a schematic view of another example optoelectronic assembly.

FIG. 4A is a schematic view of an example optoelectronic assembly 400. The optoelectronic assembly 400 may include any suitable aspects described with respect to the optoelectronic assembly 100, and similar components have been indicated with similar numbering for brevity. However, the optoelectronic assembly 400 includes a directional coupler 406 rather than an MMI coupler.

Similar to the optoelectronic assembly 100, the optoelectronic assembly 400 includes the two lasers 102, 104 in the laser array 110 and the two amplifiers 112, 114 in an amplifier array 120. The directional coupler 406 includes two inputs and two outputs. The two inputs correspond to the lasers 102, 104, and the two outputs correspond to the amplifiers 112, 114. The amplifier array 120 may be optically coupled to the directional coupler 406 and may amplify the two sets of optical signals received from the directional coupler 406.

The directional coupler 406 may be optically coupled to the laser array 110. The directional coupler 406 may split, multiplex and/or demultiplex the optical signals from the laser array 110. The amplifier array 120 may be optically coupled to the directional coupler 406 and may amplify the optical signals received from the directional coupler 406. The directional coupler 406 may optically couple the lasers 102, 104 of the laser array 110 on its input side with the amplifiers 112, 114 of the amplifier array 120 on the output side. In some configurations, the directional coupler 406 may optically couple the lasers 102, 104 and the amplifiers 112, 114 using waveguides, with one waveguide corresponding to each of the lasers 102, 104 and the amplifiers 112, 114, as shown.

In some configurations, the laser array 110, the directional coupler 406 and the amplifier array 120 may be included on a single optoelectronic chip 416, thereby reducing the size and cost of the resulting assembly. In addition, since the laser array 110 includes the primary laser 102 and the spare laser 104, which may be activated if the primary laser 102 fails, the manufacturing yield and reliability of the optoelectronic assembly 100 may be improved.

In the illustrated configuration, the directional coupler 406 is a 2×2 directional coupler 406, meaning the directional coupler 406 includes two inputs and two outputs. The inputs correspond with the two lasers 102, 104, and the outputs correspond with the two amplifiers 112, 114. Optical signals from the laser 102 may enter the directional coupler 406 and may be split in half by the directional coupler 406, with about half of the optical signals traveling to the amplifier 112 and the other half of the optical signals traveling to the amplifier 114. Similarly, optical signals from the laser 104 may enter the directional coupler 406 and may be split in half by the directional coupler 406, with about half of the optical signals traveling to the amplifier 112 and the other half of the optical signals traveling to the amplifier 114. In such configurations, the optical signals entering the amplifiers 112, 114 may be substantially the same (e.g., half of the optical signals generated by the laser 102 or the laser 104).

If the laser 104 is configured as a spare for the laser 102, both lasers may generate the same or similar optical signals, depending on which one is activated, and the directional coupler 406 may split the optical signals in the same manner, regardless of whether the optical signals are generated by the laser 102 or the laser 104.

As mentioned above, the directional coupler 406 may also be configured as a multiplexer (mux). For example, if the lasers 102, 104 are operating at the same time, the directional coupler 406 may combine the optical signals (thereby operating as a multiplexer to multiplex the optical signals). The directional coupler 406 may also split the combined optical signals, for example, such that half of the combined optical signals travel through the first output to the amplifier 112, and the other half of the combined optical signals travel through the second output to the amplifier 114. Accordingly, the optical signals entering the amplifiers 112, 114 may be substantially the same (e.g., half of the combined optical signals generated by both the laser 102 and the laser 104). In such configurations, the power of the optical signals from both of the lasers 102, 104 may be combined in the directional coupler 406.

In some configurations, the lasers 102, 104 may each generate optical signals with different wavelengths, which in turn may be multiplexed by the directional coupler 406 to generate combined optical signals with two different wavelengths, which are in turn split by the directional coupler 406 and output to the amplifiers 112, 114. In such configurations, the optical signals entering the amplifiers 112, 114 may each include half of the combined optical signals with two different wavelengths generated by both the laser 102 and the laser 104.

The optoelectronic assembly 400 may include a quantum well intermixing region 408, which may be included in the directional coupler 406 and/or in the waveguides coupling the directional coupler 406. The quantum well intermixing region 408 may be a region of material that is transparent to the wavelengths of light generated by the lasers 102, 104, so optical signals generated by the lasers 102, 104 are not absorbed or lost as they travel through the directional coupler 406. In such circumstances, the directional coupler 406 may be a passive optical component.

The quantum well intermixing region 408 may be integrally formed on the optoelectronic chip 416. For example, the quantum well intermixing region 408 may formed by changing the band gap of the material of the optoelectronic chip 416 in the area of directional coupler 406. The quantum well intermixing region 408 may be doped and annealed in the quantum well intermixing region 408 thereby changing the composition and the band gap of the material, such that the material does not absorb desired wavelengths of optical signals (e.g., the wavelengths generated by the lasers 102, 104).

Figure 4B:
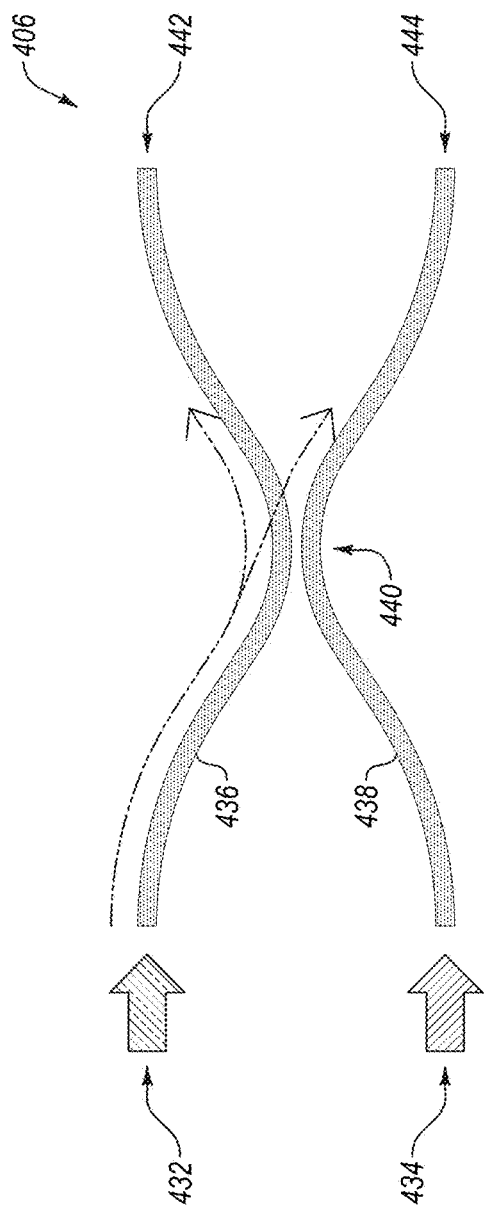
FIG. 4B is a schematic view of an example of a directional coupler that may be implemented in the optoelectronic assembly of FIG. 4A.

FIG. 4B is a schematic view of the directional coupler 406. With attention to Figure B, the directional coupler 406 will be described in further detail. As mentioned above, the directional coupler 406 is a 2×2 directional coupler 406, including two inputs 432, 434 and two outputs 442, 444. The inputs correspond with the two lasers 102, 104, and the outputs correspond with the two amplifiers 112, 114.

The directional coupler may include two waveguides 436, 438, each corresponding to one of the inputs 432, 434 and one of the outputs 442, 444. As shown, the waveguide 436 extends between the input 432 and the output 442. Similarly, the waveguide 438 extends between the input 434 and the output 444. The waveguides 436, 438 are routed to be positioned close to one another in a coupling region 440. In some configurations, the waveguides 436, 438 are positioned close enough to one another to form a hybrid mode. When optical signals travelling through one of the waveguides 436, 438 propagates through the coupling region 440, the light from a first waveguide (e.g., waveguide 436) will propagate into a second waveguides (e.g., waveguide 438). The amount and power of the optical signals propagating through the waveguides 436, 438 may be determined by the length of the coupling region 440 and the distance between the waveguides 436, 438 in the coupling region 440. However, the coupling region 440 may be configured such that substantially equal amounts of the optical signals propagate through both of the waveguides 436, 438 to the outputs 442, 444.

As indicated by arrows, optical signals from the laser 102 may enter the directional coupler 406 at the input 432. The optical signals may travel through the waveguide 436 to the coupling region 440 and may be split in half at the coupling region 440. About half of the optical signals may travel through the waveguide 436 to the output 442, and about half of the optical signals may travel through the waveguide 438 to the output 444.

If the spare laser 104 is activated instead of the main laser 102, optical signals from the laser 104 may enter the directional coupler 406 via the input 434. The optical signals may travel through the waveguide 438 to the coupling region 440 and may be split in half at the coupling region 440, with about half of the optical signals travelling through the waveguide 436 to the output 442, and about half of the optical signals travelling through the waveguide 438 to the output 444.

In some circumstances, directional couplers may have lower optical signal loss and smaller optical signal reflection when compared to MMI couplers.

In the illustrated configuration, the optoelectronic assembly 400 includes two inputs and two outputs. However, the optoelectronic assembly 400 may include any suitable number of inputs and outputs. In such configurations, the directional coupler 406 may also include any desired number if inputs and outputs. In configurations where the directional coupler 406 includes more inputs and/or outputs, the directional coupler 406 may include a multilayer directional coupler tree. For example, the directional coupler 406 may include a tree structure with multiple directional couplers and/or coupling regions cascaded for multiple inputs and/or outputs (e.g., corresponding to each laser in the laser array and/or each amplifier in the amplifier array). Such configurations may be implemented instead of the MMI couplers of FIGS. 1-3.

Figure 4C:
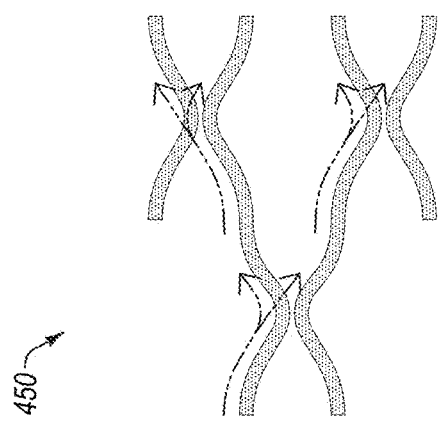
FIGS. 4C-4D are schematic views of other examples of directional couplers.
Figure 4D:
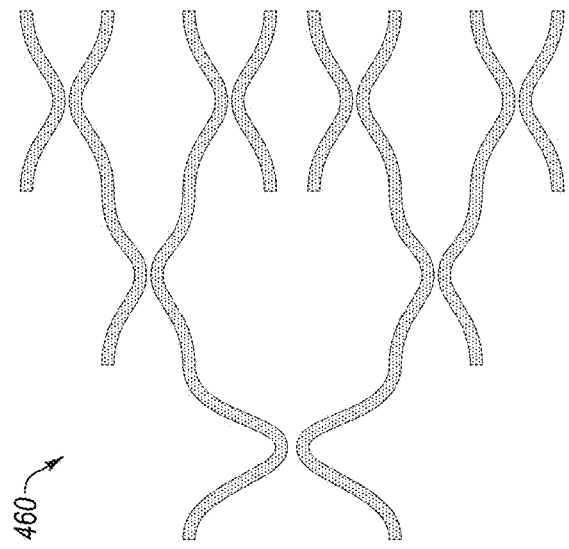

FIGS. 4C-4D are schematic views of alternative examples of directional couplers 450, 460. As illustrated in FIGS. 4C-4D, directional couplers may be configured to include any suitable number of inputs, outputs, waveguides and coupling regions.

For example, the directional coupler 450 includes two inputs and four outputs, with four waveguides and three coupling regions, where the respective waveguides are positioned close to another. As indicated by arrows, optical signals may be input at one of the two inputs, the optical signals may be split at a first coupling region, such that optical signals propagate through two of the waveguides. The optical signals may then propagate through the two waveguides to second and third coupling regions, and the optical signals may again be split such that the optical signals propagate through four of the waveguides to the four outputs.

In another example, the directional coupler 460 includes two inputs and eight outputs, with eight waveguides and seven coupling regions, where the respective waveguides are positioned close to another. Optical signals may be input at one of the two inputs, the optical signals may be split at the coupling regions, such that optical signals propagate through the eight waveguides to the eight outputs. Although FIGS. 4C-4D illustrate two examples of directional coupler configurations, the concepts described may be implemented for directional couplers with any suitable number of inputs and outputs.

Figure 5:
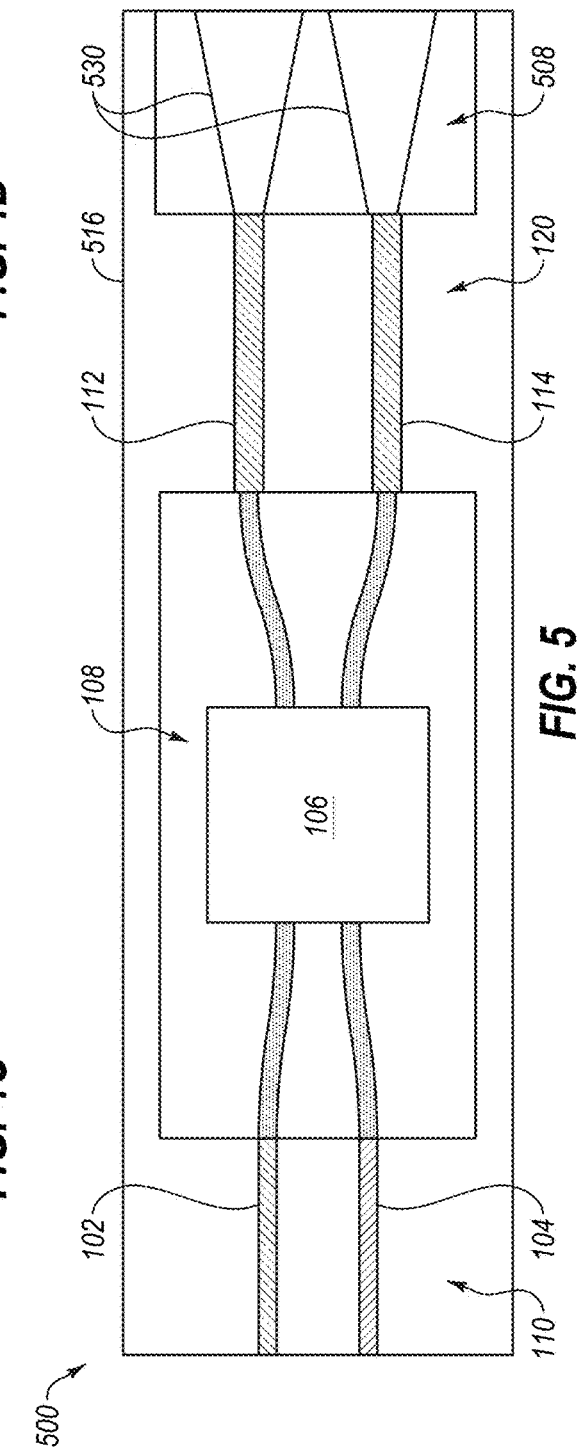
FIG. 5 is a schematic view of another example optoelectronic assembly.

FIG. 5 is a schematic view of an example optoelectronic assembly 500. The optoelectronic assembly 500 may include any suitable aspects described with respect to the optoelectronic assembly 100, and similar components have been indicated with similar numbering for brevity. However, the optoelectronic assembly 500 also includes spot size converters 530 optically coupled to the amplifiers 112, 114.

In particular, the spot size converters 530 may be optically coupled to the output of the amplifiers 112, 114. The spot size converters 530 may increase the output mode size of optical signals received from the amplifiers 112, 114 to improve coupling to optical fibers (see for example, the optical fibers 228 of FIG. 2). The spot size converters 530 may include any suitable configuration to increase the output mode size of optical signal. For example, as shown in FIG. 5, the spot size converters 530 may include a tapering waveguide to increase the output mode size of optical signal, although other configurations may be implemented.

In addition to the quantum well intermixing region 108, the optoelectronic assembly 500 may include a second quantum well intermixing region 508 corresponding to the spot size converters 530. The quantum well intermixing region 508 may be a region of material of the spot size converters 530 that is transparent to the wavelengths of light generated by the lasers 102, 104, so optical signals generated by the lasers 102, 104 are not absorbed or lost as they travel through the spot size converters 530. In such circumstances, the spot size converters 530 may be a passive optical component.

The quantum well intermixing region 508 may be integrally formed on an optoelectronic chip 516. For example, the quantum well intermixing region 508 may formed by changing the band gap of the material of the optoelectronic chip 516 in the area of the spot size converters 530. The quantum well intermixing region 508 may then be doped and annealed in the quantum well intermixing region 508 thereby changing the composition and the band gap of the material, such that the material does not absorb desired wavelengths of optical signals (e.g., the wavelengths generated by the lasers 102, 104). Accordingly, the quantum well intermixing region 508 of the spot size converters 530 may also reduce absorption loss of optical signals traveling through the optoelectronic assembly 500.

As explained above, quantum well intermixing regions may be included in optoelectronic assemblies, for example, in MMI couplers and/or in waveguides. The quantum well intermixing regions may be regions of material that are transparent to certain wavelengths of light so optical signals are not absorbed or lost as they travel through the MMI coupler.

Figure 6:
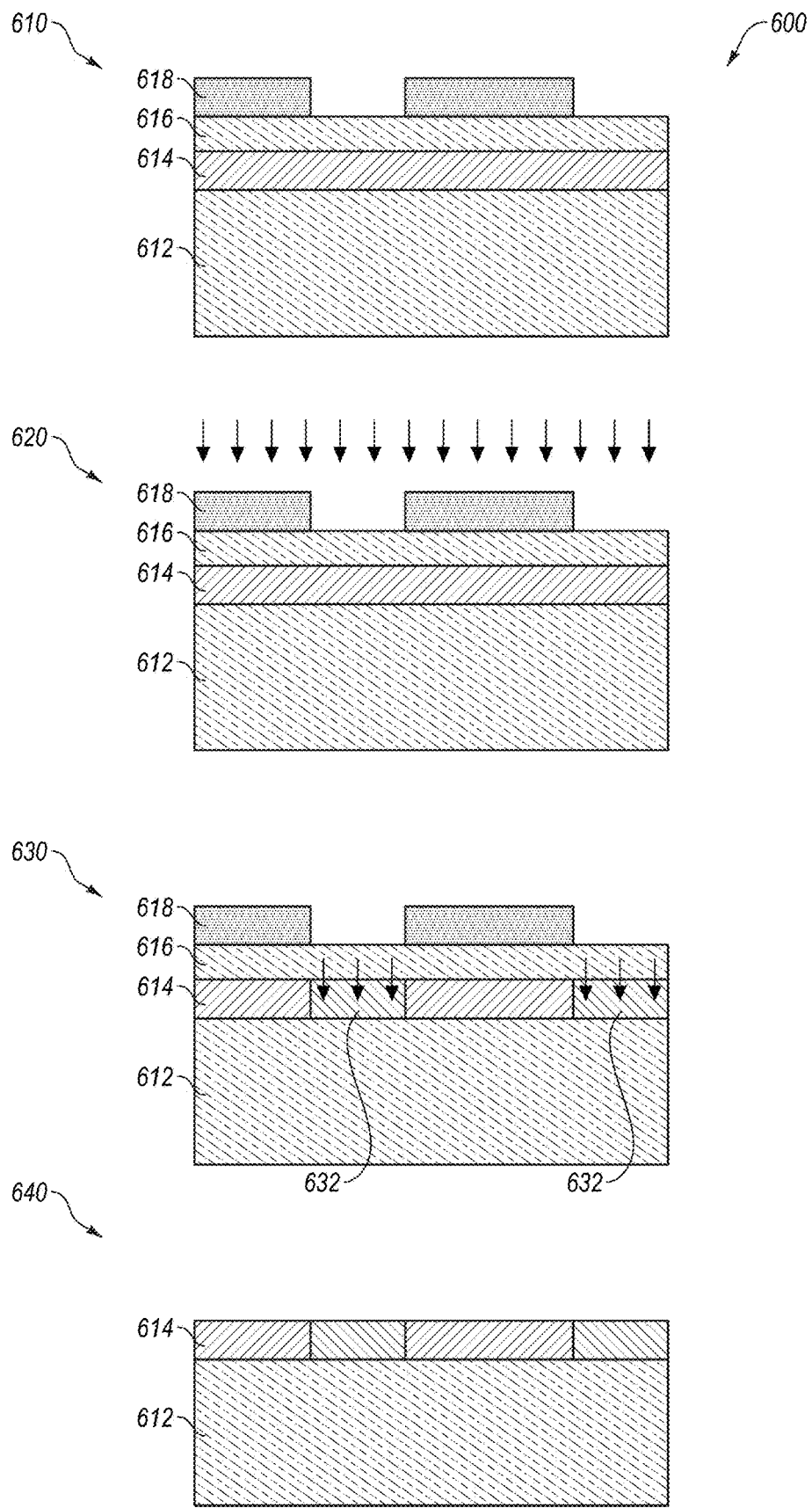
FIG. 6 illustrates schematic views of example steps to form a quantum well intermixing region.

FIG. 6 illustrates schematic views of example steps to form a quantum well intermixing region. In particular, FIG. 6 includes a method 600 of forming a quantum well intermixing region. The method 600 may begin at step 610, in which one or more layers may be deposited on or over a substrate 612. A quantum well and barrier layer 614 may be deposited on or over the substrate 612. Further, a buffer layer 616 may be deposited on or over the quantum well and barrier layer 614. A cap layer 618 may be deposited on or over the buffer layer 616. The cap layer 618 may be selectively deposited and/or patterned in desired areas on or over the buffer layer 616. In some configurations, the cap layer 618 may include silicon nitride (SiN).

At step 620, the assembly may undergo ion implantation. In particular, ions may be directed to and implanted in the buffer layer 616. Ion implantation may add extra phosphorus ions and create defects in the buffer layer 616.

At step 630, the assembly may undergo rapid thermal annealing and/or thermal annealing. Annealing may result in the diffusion of vacancies in the quantum well and barrier layer 614. Accordingly, annealing may create an MMI region 632 and/or a spot size converter region 634 positioned in between the areas of the quantum well and barrier layer 614 that are exposed by the cap layer 618. After annealing, the ions in the buffer layer 616 diffuse into the quantum well and barrier layer 614 and cause composition changes in the quantum well and therefore band gap changes.

At step 640, the cap layer 618 and the buffer layer 616 may be removed, thereby exposing the quantum well and barrier layer 614 that includes the MMI region 632 and the spot size converter region 634.

As explained above, other configurations besides quantum well intermixing regions may be implemented to reduce or eliminate absorption loss in the MMI couplers. For example, butt joints and/or selective regrowth regions may be used to create passive regions in the MMI couplers such that optical signals travelling through the MMI couplers are not absorbed.

Figure 7:
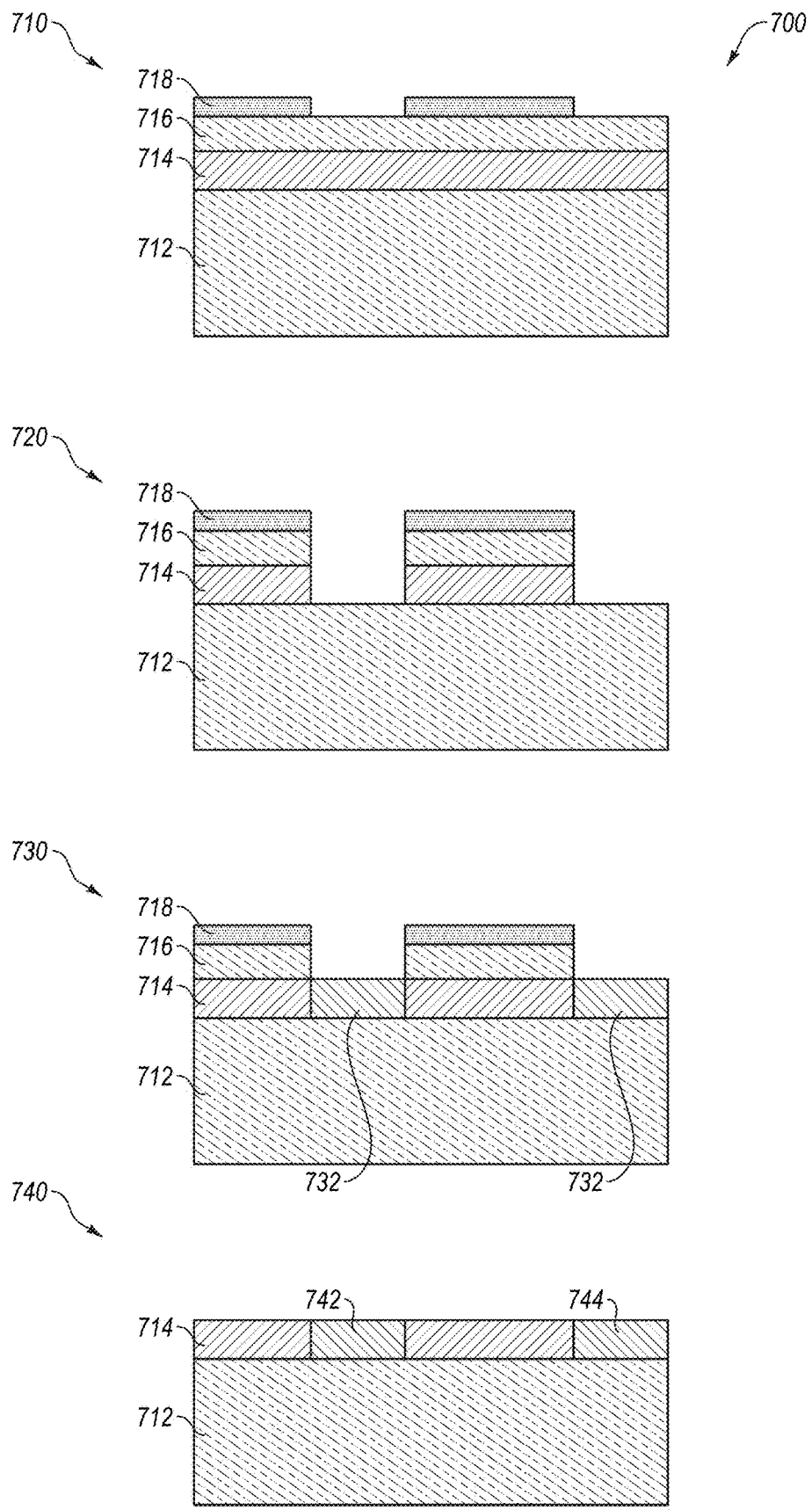
FIG. 7 illustrates schematic views of example steps to form butt joints and/or selective regrowth regions.

FIG. 7 illustrates schematic views of example steps to a form multimode interference coupler. In particular, FIG. 7 illustrates a method 700 of forming butt joints and/or selective regrowth regions for the multimode interference coupler. The method 700 may begin at step 710, in which layers may be deposited on or over a substrate 712. A quantum well and barrier layer 714 may be deposited on or over the substrate 712. Further, a hard mask 716 may be deposited on or over the quantum well and barrier layer 714. A mask 718 may be deposited on or over the hard mask 716. The mask 718 may be selectively deposited and/or patterned in desired areas on or over the hard mask 716. In some configurations, the hard mask 716 and/or the mask 718 may include silicon nitride (SiN).

At step 720, the assembly may undergo dry and/or wet etching. In particular, etching may remove portions of the hard mask 716, the mask 718 and/or portions of the quantum well and barrier layer 714 in areas that are not covered by the hard mask 716 or the mask 718. Accordingly, portions of the hard mask 716 and the quantum well and barrier layer 714 in between the mask 718 may be removed. After etching, the quantum well and barrier layer 714 may include spaces for butt joints to be formed.

At step 730, the assembly may undergo selective regrowth. Selective regrowth may form butt joints 732 in the spaces of the quantum well and barrier layer 714 exposed during etching.

At step 740, the mask 718 and the hard mask 716 may be removed, thereby exposing the quantum well and barrier layer 714 that includes an MMI region 742 and a spot size convertor region 744.

In some configurations, a mask may be deposited on the whole wafer (or the entire chip) and patterned to form the lasers, amplifiers, multimode interference couplers, and/or the spot size convertors simultaneously.

In yet another example, a method may be implemented to form a multimode interference coupler region and/or the spot size converter region. The method may include patterning a mask on the quantum well and barrier layers, etching to remove portions of the quantum well and barrier layer not covered by the mask, selective regrowing a passive waveguide layer that is transparent to the laser light. The waveguide may be patterned and formed in the passive waveguide layer butt joints in spaces of the quantum well and barrier layer exposed during etching. A mask may be deposited on the wafer and patterned to form the lasers, amplifiers, multimode interference couplers and the spot size convertors simultaneously.

For the processes and/or methods disclosed, the functions performed in the processes and methods may be implemented in differing order as may be indicated by context. Furthermore, the outlined steps and operations are only provided as examples, and some of the steps and operations may be optional, combined into fewer steps and operations, or expanded into additional steps and operations.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic assembly comprising:
a single optoelectronic chip comprising:
a laser array including at least one primary laser and at least one spare laser configured to be activated when the primary laser fails, wherein the laser array is configured to transmit optical signals;
an amplifier array including a plurality of amplifiers, each configured to amplify the optical signals received from the laser array and output amplified optical signals; and
a multimode interference (MMI) coupler integral to the single optoelectronic chip, the MMI coupler configured to optically couple the laser array and the amplifier array;
a lens array comprising a plurality of optical lenses disposed adjacent to the amplifier array;
a fiber array comprising a plurality of optical fibers; and
an isolator disposed between the lens array and the fiber array,
wherein the isolator is configured to allow unidirectional travel of the amplified optical signals from the lens array to the fiber array.

2. The optoelectronic assembly of claim 1, wherein the MMI coupler comprises a quantum well intermixing region that is transparent to wavelengths of light generated by the laser array.

3. The optoelectronic assembly of claim 2, wherein the quantum well intermixing region is integrally formed on the single optoelectronic chip with the laser array, the MMI coupler, and the amplifier array.

4. The optoelectronic assembly of claim 1, wherein the MMI coupler is configured to split the optical signals from the laser array into a plurality of split optical signals and transmit each of the plurality of split optical signals to one of the plurality of amplifiers of the amplifier array.

5. The optoelectronic assembly of claim 4, wherein each of the plurality of split optical signals are substantially the same.

6. The optoelectronic assembly of claim 4, wherein the laser array includes at least two primary lasers, and the MMI coupler is configured to multiplex the optical signals from the primary lasers prior to the plurality of split optical signals being transmitted to the one of the plurality of amplifiers of the amplifier array.

7. The optoelectronic assembly of claim 6, wherein the at least two primary lasers are configured to generate different wavelengths of the optical signals, and the MMI coupler is configured to multiplex both of the different wavelengths prior to the plurality of split optical signals being transmitted to the one of the plurality of amplifiers of the amplifier array.

8. The optoelectronic assembly of claim 1, further comprising a plurality of spot size converters, each optically coupled to one of the plurality of amplifiers of the amplifier array.

9. The optoelectronic assembly of claim 8, wherein the plurality of spot size converters include a tapering waveguide configured to increase an output mode size of the optical signals.

10. The optoelectronic assembly of claim 1, wherein each of the plurality of optical lenses has a pitch that as the same as one or more of: (i) a pitch of the plurality of amplifiers; (ii) a pitch of the isolator; and (iii) a pitch of the fiber array.

11. The optoelectronic assembly of claim 1, wherein the amplified optical signals are optically coupled to the plurality of optical fibers.

12. The optoelectronic assembly of claim 1, wherein a total number of the plurality of optical lenses is the same as a total number of output ports of the MMI coupler.

13. The optoelectronic assembly of claim 1, wherein a total number of the plurality of optical fibers is the same as a total number of output ports of the MMI coupler.

14. The optoelectronic assembly of claim 1, wherein a total number of output ports of the MMI coupler is the same as a total number of input ports of the MMI coupler.

15. The optoelectronic assembly of claim 1, wherein a total number of output ports of the MMI coupler is different as a total number of input ports of the MMI coupler.

16. An optoelectronic assembly comprising:
a single optoelectronic chip comprising:
a laser array including a primary laser and a spare laser configured to be activated when the primary laser fails;
an amplifier array including a plurality of amplifiers, each configured to amplify optical signals received from the laser array and output amplifier optical signals; and
an optical coupler integral to the single optoelectronic chip, the optical coupler configured to optically couple the laser array and the amplifier array,
a lens array comprising a plurality of optical lenses disposed adjacent to the amplifier array;
a fiber array comprising a plurality of optical fibers; and
an isolator disposed between the lens array and the fiber array,
wherein the isolator is configured to allow unidirectional travel of the amplified optical signals from the lens array to the fiber array.

17. The optoelectronic assembly of claim 16,
wherein the optical coupler comprising a plurality of waveguides,
wherein a first waveguide of the plurality of waveguides is configured to be optically coupled to the primary laser, and a second waveguide of the plurality of waveguides is configured to be optically coupled to the spare laser, and
wherein the first waveguide and the second waveguide are routed to be positioned at a distance to one another in a coupling region such that the optical signals received from the laser array form a hybrid mode to travel to the plurality of amplifiers of the amplifier array.

18. The optoelectronic assembly of claim 16, wherein the optical coupler is configured to split the optical signals from the laser array into a plurality of split optical signals and transmit each of the plurality of split optical signals to one of the plurality of amplifiers of the amplifier array.

19. The optoelectronic assembly of claim 16, the optical coupler comprising at least one waveguide for each laser of the laser array.

20. The optoelectronic assembly of claim 16, wherein the optical coupler comprises a tree structure with cascaded coupling regions corresponding to one of: (i) each of the primary laser and the spare laser in the laser array; and (ii) each of the plurality of amplifiers in the amplifier array.

* * * * *